(12) United States Patent
Byun

(10) Patent No.: US 11,626,387 B2
(45) Date of Patent: Apr. 11, 2023

(54) IMAGE SENSING DEVICE

(71) Applicant: SK hynix Inc., Icheon-si (KR)

(72) Inventor: Kyung Su Byun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/368,592

(22) Filed: Jul. 6, 2021

(65) Prior Publication Data

US 2022/0165710 A1   May 26, 2022

(30) Foreign Application Priority Data

Nov. 20, 2020   (KR) .................. 10-2020-0156828

(51) Int. Cl.
  *H01L 25/065*   (2006.01)
  *H01L 25/18*    (2023.01)
  *H01L 27/146*   (2006.01)
(52) U.S. Cl.
  CPC .......... *H01L 25/0657* (2013.01); *H01L 25/18* (2013.01); *H01L 27/14603* (2013.01); *H01L 27/14621* (2013.01); *H01L 27/14645* (2013.01); *H01L 27/14649* (2013.01)
(58) Field of Classification Search
  CPC .................................................. H01L 24/14605
  See application file for complete search history.

(56) References Cited

U.S. PATENT DOCUMENTS

2015/0053546 A1*  2/2015  Hart .................. G01N 21/6486
                                                  250/372

FOREIGN PATENT DOCUMENTS

KR         101334219 B1    11/2013
KR         20180027783 A    3/2018

* cited by examiner

*Primary Examiner* — Yu-Hsi D Sun
(74) *Attorney, Agent, or Firm* — Perkins Coie LLP

(57) ABSTRACT

An image sensing device includes a first pixel array and a second pixel array. The first pixel array includes a plurality of first unit pixels consecutively arranged to generate a first pixel signal through a photoelectric conversion of incident light. The second pixel array is disposed below the first pixel array, and includes a plurality of second unit pixels consecutively arranged to generate a second pixel signal through a photoelectric conversion of the incident light. The first unit pixels are arranged to have a uniform spacing between adjacent first unit pixels in the first pixel array. The second unit pixels are arranged so that spacing between adjacent second unit pixels are not the same in the second pixel array.

20 Claims, 6 Drawing Sheets

US 11,626,387 B2

IMAGE SENSING DEVICE

CROSS-REFERENCE TO RELATED APPLICATION

This patent document claims the priority and benefits of Korean patent application No. 10-2020-0156828, filed on Nov. 20, 2020, which is incorporated by reference in its entirety as part of the disclosure of this patent document.

TECHNICAL FIELD

The technology and implementations disclosed in this patent document generally relate to an image sensing device.

BACKGROUND

An image sensor is a device for capturing optical images by converting light into electrical signals using a photosensitive semiconductor material which reacts to light. With the recent development of automotive, medical, computer and communication industries, the demand for high-performance image sensors is increasing in various fields such as smart phones, digital cameras, camcorders, personal communication systems (PCSs), video game consoles, IoT (Internet of Things), robots, surveillance cameras, medical micro cameras, etc.

SUMMARY

Various embodiments of the disclosed technology relate to an image sensing device including a lower pixel array and an upper pixel array and allows a sufficient amount of light to reach photoelectric conversion elements of the lower pixel array.

In accordance with an embodiment of the disclosed technology, an image sensing device may include a first pixel array and a second pixel array. The first pixel array includes a plurality of first unit pixels consecutively arranged to generate a first pixel signal through a photoelectric conversion of incident light. The second pixel array is disposed below the first pixel array, and includes a plurality of second unit pixels consecutively arranged to generate a second pixel signal through a photoelectric conversion of the incident light. The first unit pixels are arranged to have a uniform spacing between adjacent first unit pixels in the first pixel array. The second unit pixels are arranged so that spacing between adjacent second unit pixels are not the same in the second pixel array.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Some implementations of the disclosed technology can be used to provide designs of an image sensing device including different pixel arrays (e.g., a lower pixel array and an upper pixel array) that are stacked over each other in a three-dimensional (3D) stacked structure so that incident light are first received by an upper pixel array and a portion of the incident light passes the upper pixel array to reach a lower pixel array so that upper and lower pixel arrays operate to detect the incident light. This use of stacked different pixel arrays in a three-dimensional (3D) stacked structure allows a sufficient amount of light to reach photoelectric conversion elements of a lower pixel array.

Figure 1:
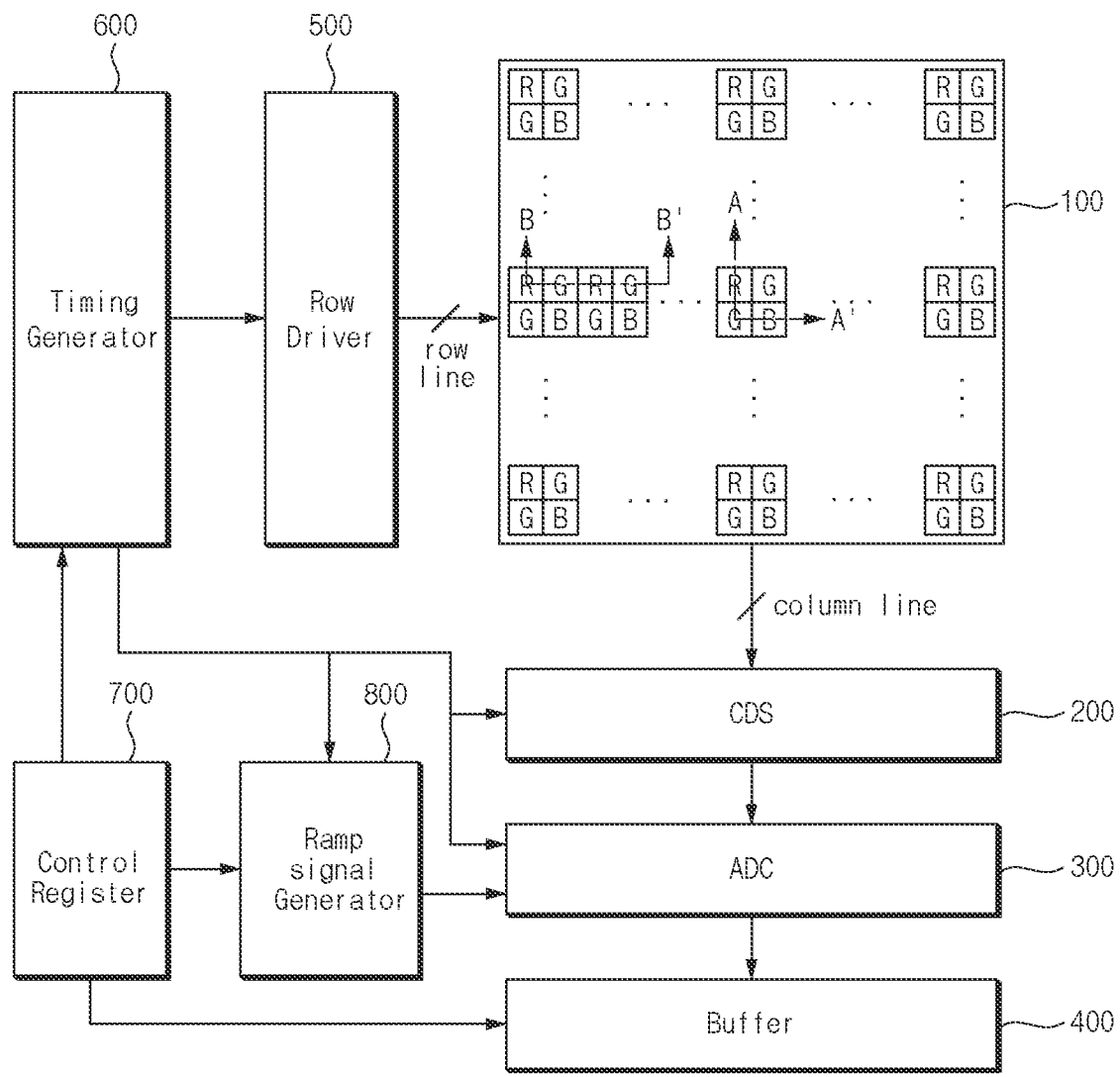
FIG. 1 is a block diagram illustrating an example of an image sensing device based on some implementations of the disclosed technology.
Figure 2:
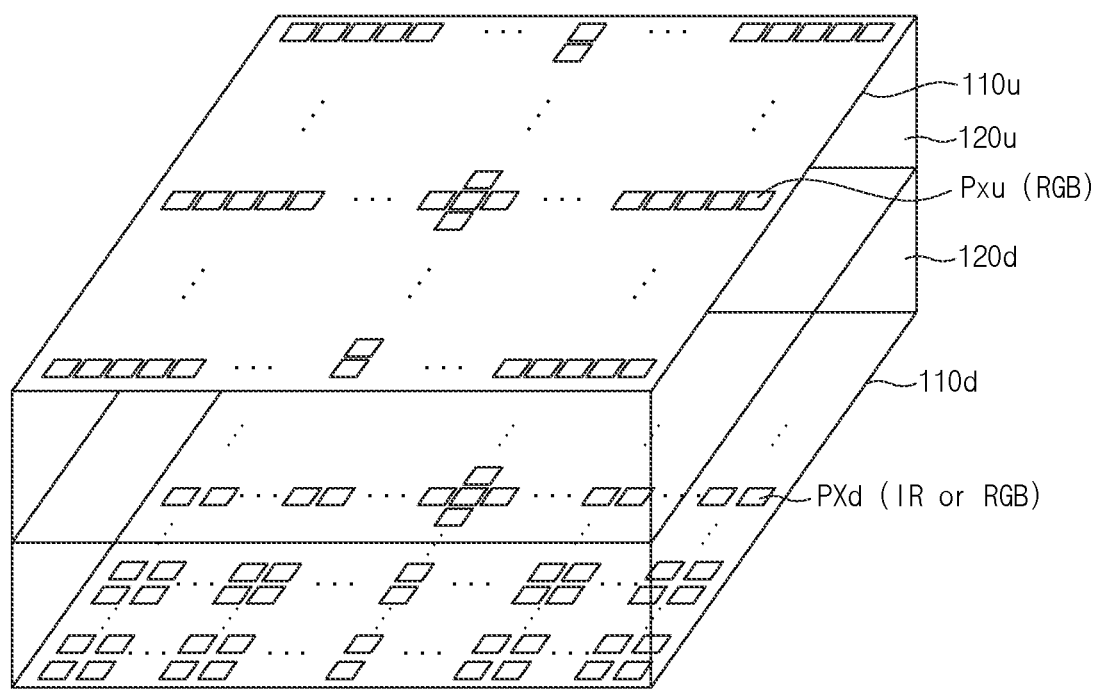
FIG. 2 is a perspective view illustrating a pixel array shown in FIG. 1 based on some implementations of the disclosed technology.

FIG. 1 is a block diagram illustrating an example of an image sensing device based on some implementations of the disclosed technology. FIG. 2 is a schematic diagram illustrating an example layout of a pixel array 100 shown in FIG. 1 based on some implementations of the disclosed technology.

Referring to FIGS. 1 and 2, the image sensing device may include a pixel array 100 that includes two stacked pixel arrays as an example, a correlated double sampler (CDS) 200, an analog-to-digital converter (ADC) 300, a buffer 400, a row driver 500, a timing generator 600, a control register 700, and a ramp signal generator 800. As illustrated in FIG. 1, each pixel array may include a color filter array with color filters in different colors (such as red (R), green (G) and blue (B)) that are arranged in a suitable color filter pattern to properly capture color information of a scene or object to be imaged.

As shown in FIG. 2, this example of the pixel array 100 includes an upper pixel array 110u and a lower pixel array 110d that are vertically spaced from each other and laterally overlap to collectively detect incident light. The upper pixel array 110u may include a plurality of upper unit pixels (PXu) consecutively arranged in a two-dimensional (2D) structure in which the upper unit pixels (PXu) are arranged in row and column directions. The lower pixel array 110d may include a plurality of lower unit pixels (PXd) consecutively arranged in a two-dimensional (2D) structure in which the lower unit pixels (PXd) are arranged in row and column directions. The upper unit pixels (PXu) and the lower unit pixel (PXd) may include a plurality of photoelectric conversion elements configured to generate photocharges through photoelectric conversion of incident light received from the outside, and a plurality of pixel transistors configured to output an electrical signal (i.e., a pixel signal) corresponding to the photocharges generated by the photoelectric conversion elements. The upper unit pixels (PXu) may include red pixels, green pixels, and blue pixels that are configured to generate a corresponding pixel signal (e.g., a first pixel signal) through photoelectric conversion of red visible light, green visible light, and blue visible light, respectively. The red pixels, the green pixels, and the blue pixels may be arranged in a Bayer pattern. The lower unit pixels (PXd) may include infrared (IR) pixels that generate a pixel signal (e.g., a second pixel signal) through photoelectric conversion of light (e.g., infrared (IR) light) having a longer wavelength than red, green, and blue visible light. Alternatively, the lower unit pixels (PXd) may include red pixels, green pixels, and blue pixels arranged in the Bayer pattern in the same manner as in the upper unit pixels (PXu). Thus, the image sensing device based on some implementations of the disclosed technology may have a stacked structure including different pixel arrays such as upper and lower pixel arrays. In some implementations, the upper and lower pixel arrays may include the same type of pixels and, in other implementations, the upper and lower pixel arrays may include different types of pixels. The type of a pixel may be selected based on the wavelengths or spectra of incident light to be detected by a particular pixel array, for example, whether the pixel array is used to generate the pixel signal in response to visible light or light in infrared or far infrared spectral range.

The upper unit pixels (PXu) and the lower unit pixels (PXd) may be formed in one-to-one correspondence. As can be seen from FIG. 2, whereas the upper unit pixels (PXu) may be arranged in row and column directions at uniform spacing or spatial interval, the lower unit pixels (PXd) may be arranged so that the spacing between adjacent unit pixels may change with location. For example, the distance (or an interval) between adjacent unit pixels may gradually increase in a direction from a center of the lower pixel array 110d to an edge of the lower pixel array 110d. In one implementation of this vary pixel spacing, the distance (i.e., a width of a device isolation structure) between adjacent lower unit pixels (PXd) may gradually increase in response to a Chief Ray Angle (CRA) in the direction from the center to the edge of the lower pixel array 110d, or may gradually increase in the direction from the center to the edge of the lower pixel array 110d in units of a predetermined region.

An upper interconnection structure 120u may be coupled to the upper unit pixels (PXu). A lower interconnection structure 120d may be coupled to the lower unit pixels (Pxd). The upper interconnection structure 120u and the lower interconnection structure 120d may be formed between the upper pixel array 110u and the lower pixel array 110d. In some implementations, each of the upper interconnection structure and the lower interconnection structure may be implemented as an interconnection layer or interconnection line. For example, each of the upper interconnection structure and the lower interconnection structure may include conductive lines. In this patent document, the upper interconnection structure and the lower interconnection structure are referred to as the upper interconnection layer and the lower interconnection layer. But other implementations are also possible.

The correlated double sampler (CDS) 200 may sample pixel signals received from the unit pixels PXu and PXd of the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count a level transition time of the comparison signal in response to a clock signal received from the timing generator 600, and may output a count value indicating the counted level transition time to the buffer 400.

The buffer 400 may store each of the digital signals received from the analog-to-digital converter (ADC) 300, may sense and amplify each of the digital signals, and may output each of the amplified digital signals.

The row driver 500 may enable or drive the pixel array 100 in response to an output signal of the timing generator 600. For example, the row driver 500 may output drive signals for controlling operations of transistors contained in the unit pixels PXu and PXd to the pixel array 100, and may drive the unit pixels PXu and PXd in units of a row line.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal for controlling an output signal of the analog-to-digital converter (ADC) 300 in response to a control signal of the control register 700 and a timing signal received from the timing generator 600.

Figure 3:
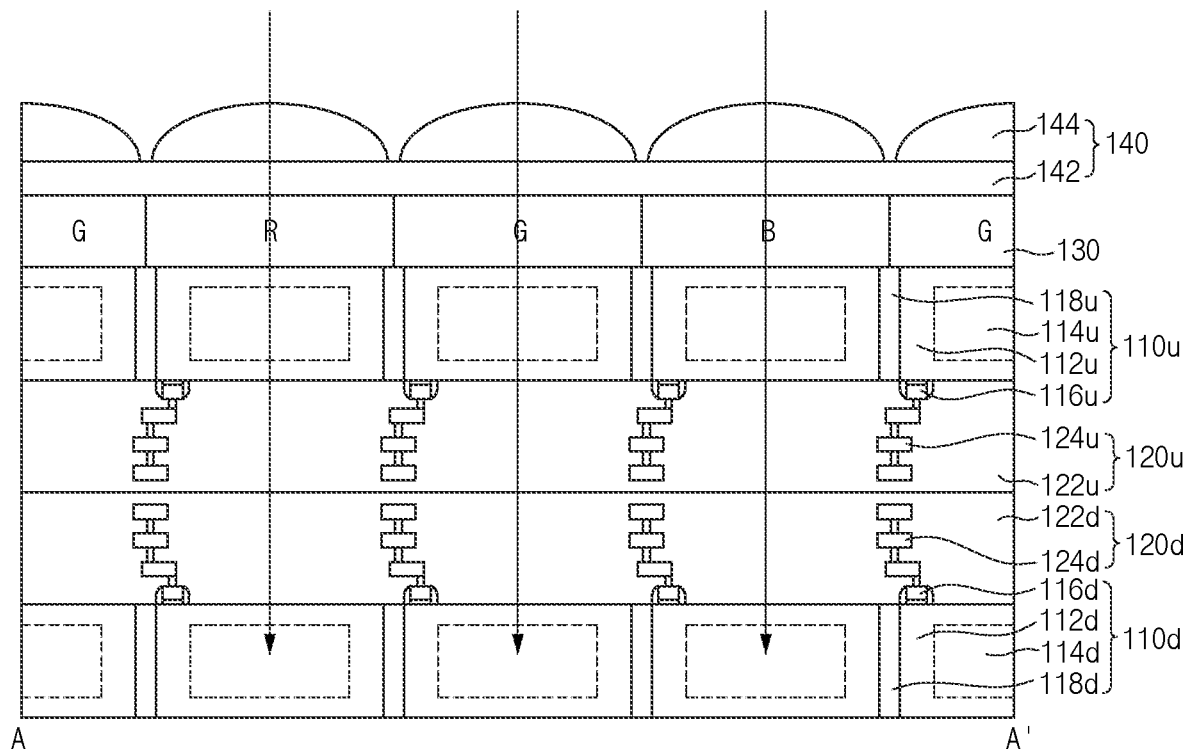
FIG. 3 is a cross-sectional view illustrating an example of the pixel array taken along the line A-A' shown in FIG. 1 based on some implementations of the disclosed technology.
Figure 4:
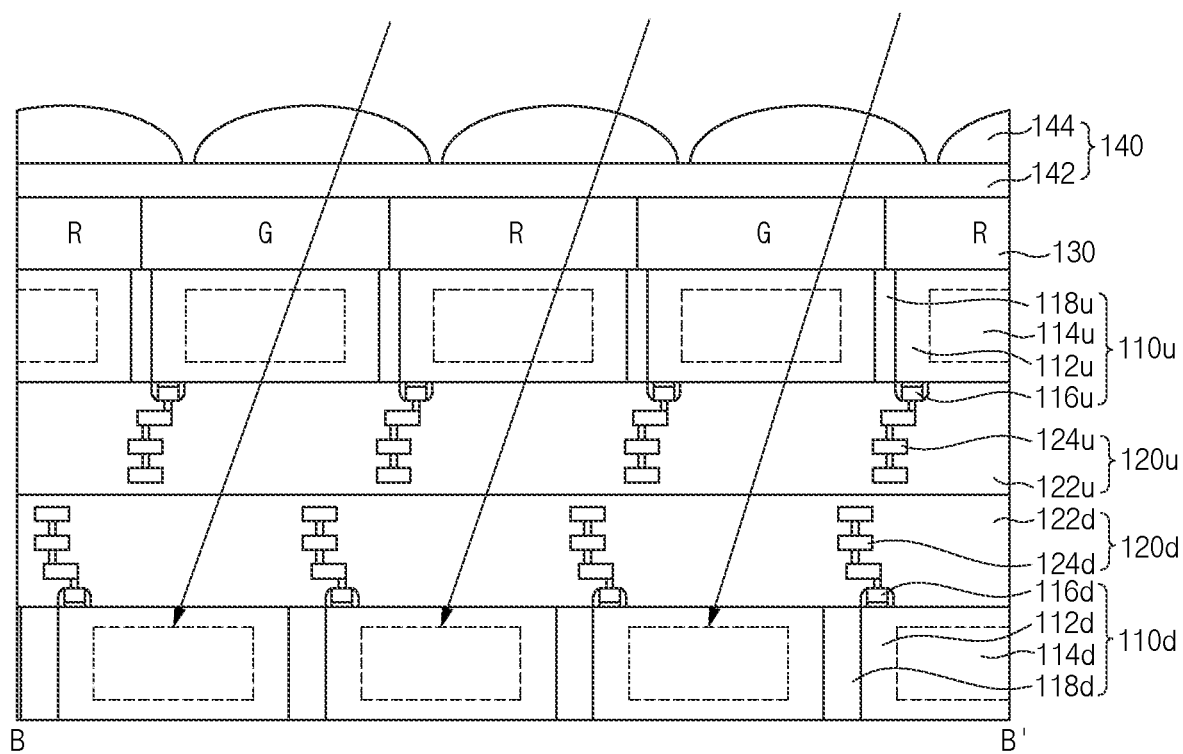
FIG. 4 is a cross-sectional view illustrating an example of the pixel array taken along the line B-B' shown in FIG. 1 based on some implementations of the disclosed technology.

FIG. 3 is a cross-sectional view illustrating an example of the pixel array taken along the line A-A' shown in FIG. 1. FIG. 4 is a cross-sectional view illustrating an example of the pixel array taken along the line B-B' shown in FIG. 1.

Referring to FIGS. 3 and 4, the pixel array 100 may include a lower pixel array 110d, a lower interconnect layer 120d, an upper pixel array 110u, an upper interconnect layer 120u, a color filter layer 130, and a lens layer 140.

The lower pixel array 110d may include a lower substrate 112d, a plurality of lower photoelectric conversion elements 114d, a plurality of lower pixel transistors 116d, and a plurality of lower device isolation structures 118d.

The lower substrate 112d may include a semiconductor substrate. The semiconductor substrate may include a first surface upon which light is incident, and a second surface facing or opposite to the first surface. The lower photoelectric conversion elements 114d may be formed in the lower substrate 112d. The lower photoelectric conversion elements 114d may generate photocharges through photoelectric conversion of light incident upon the first surface. The lower pixel transistors 116d may generate a pixel signal (e.g., a second pixel signal) corresponding to photocharges generated by the lower photoelectric conversion elements 114d. The lower pixel transistors 116d may be formed over the first surface of the lower substrate 112d, and may be coupled to the correlated double sampler (CDS) 200 or the row driver 500 through lower conductive lines 124d formed in the lower interconnect layer 120d. The lower photoelectric conversion elements 114d of the lower unit pixels (PXd) adjacent to each other in the lower substrate 112d may be isolated from each other by the lower device isolation structures 118d. Each of the lower device isolation structures 118d may include a trench isolation structure formed by filling a trench with insulating materials, or may include a junction isolation structure formed by implanting impurities. Differently from the upper device isolation structures 118u, the lower device isolation structures 118d may be formed to have different widths depending on the positions of the lower device isolation structures 118*d* formed in the lower pixel array 110*d*. For example, the lower device isolation structures 118*d* may be formed to gradually increase in width in the direction from the center of the lower pixel array 110*d* to the edge of the lower pixel array 110*d*. The lower interconnect layer 120*d* may be disposed over the first surface of the lower substrate 112*d* while being disposed between the lower pixel array 110*d* and the upper pixel array 110*u*. The lower interconnect layer 120*d* may be formed to contact the upper interconnect layer 120*u*. The lower interconnect layer 120*d* may include a lower interlayer insulation layer 122*d* and lower conductive lines 124*d* formed in the lower interlayer insulation layer 122*d*. The lower conductive lines 124*d* may be coupled to the lower pixel transistors 116*d*, and may be arranged not to vertically overlap with the lower photoelectric conversion elements 114*d*.

The upper pixel array 110*u* may include an upper substrate 112*u*, a plurality of photoelectric conversion elements 114*u*, a plurality of upper pixel transistors 116*u*, and a plurality of upper device isolation structures 118*u*.

The upper substrate 112*u* may include a semiconductor substrate. The semiconductor substrate may include a first surface upon which light is incident, and a second surface facing or opposite to the first surface. The upper photoelectric conversion elements 114*u* may be formed in the upper substrate 112*u*. The upper photoelectric conversion elements 114*u* may generate photocharges through photoelectric conversion of light incident upon the first surface. The upper pixel transistors 116*u* may generate a pixel signal (e.g., a first pixel signal) corresponding to photocharges generated by the upper photoelectric conversion elements 114*u* of the upper unit pixel (PXu). The upper pixel transistors 116*u* may be formed over the second surface of the upper substrate 112*u*, and may be coupled to the correlated double sampler (CDS) 200 or the row driver 500 through upper conductive lines 124*u* formed in the upper interconnect layer 120*u*. The upper photoelectric conversion elements 114*u* of the upper unit pixels (PXu) adjacent to each other in the upper substrate 112*u* may be isolated from each other by the upper device isolation structures 118*u*. Each of the upper device isolation structures 118*u* may include a trench isolation structure formed by filling a trench with insulating materials, or may include a junction isolation structure formed by implanting impurities. The upper device isolation structures 118*u* may be formed to have the same width in the center region and the edge region of the upper pixel array 110*u*.

The upper interconnect layer 120*u* may be disposed over the second surface of the upper substrate 112*u* while being disposed between the lower pixel array 110*d* and the upper pixel array 110*u*. The upper interconnect layer 120*u* may be formed to contact the lower interconnect layer 120*d*. The upper interconnect layer 120*u* may include an upper interlayer insulation layer 122*u* and upper conductive lines 124*u* formed in the upper interlayer insulation layer 122*u*. The upper conductive lines 124*u* may be coupled to the upper pixel transistors 116*u*, and may be arranged not to vertically overlap with the upper photoelectric conversion elements 114*u*.

The color filter layer 130 includes different color filters that cover the underlying photosensing elements and the spatial arrangement of the different color filters is designed to filter incident light using different color filters in adjacent pixels to capture color information of a scene or object to be imaged. One of suitable color filter arrangement is a Bayer color filter array of different color filters that include 50% of the total color filters to be green (G), 25% of the total color filters to be blue (B) and 25% of the total color filters to be red (R). Referring to the example in FIG. 1, the center of the pixel array 100 includes a 4×4 pixel block with two green color filters at the diagonal pixel positions and red and blue color filters at the other diagonal pixel positions based on the Bayer color arrangement. In implementing a Bayer color filter array, two adjacent color filters in the same row or column may be in different colors, or, alternatively, in the same color. One particular implementation of a Bayer color filter array for placing adjacent color filters of the same color in a row or column is a Quad-Bayer pixel structure, in which adjacent 2×2 pixels of a 4-pixel block are of the same color as a basic building block while achieving the Bayer color arrangement by having 50% of the total 4-pixel color filter blocks to be green (G), 25% of the total 4-pixel color filter blocks to be blue (B) and 25% of the total 4-pixel color filter blocks to be red (R). For example, one example of such a Quad-Bayer pixel structure may include a 4×4 4-pixel block pattern of one 4-pixel block of blue color filters, one 4-pixel block of red color filters, and two 4-pixel blocks of green color filters.

The color filter layer 130 may be formed over the first surface of the upper substrate 112*u*. The color filter layer 130 may include a plurality of red color filters (R), a plurality of green color filters (G), and a plurality of blue color filters (B). The color filters R, G, and B may be arranged in a Bayer pattern. The red color filters (R) may include a polymer organic material including a red pigment, the green color filters (G) may include a polymer organic material including a green pigment, and the blue color filters (B) may include a polymer organic material including a blue pigment. For example, the red color filters (R) may include a resist material including a red pigment, the green color filters (G) may include a resist material including a green pigment, and the blue color filters (B) may include a resist material including a blue pigment. A grid structure for preventing crosstalk between adjacent color filters may be formed between the color filters.

The lens layer 140 may be formed over the color filter layer 130. The lens layer 140 may include an over-coating layer 142 and a plurality of microlenses 144. The over-coating layer 142 and the microlenses 144 may be formed of the same materials. The over-coating layer 142 may operate as a planarization layer to compensate for (or remove) a step difference caused by the color filter layer 130. The microlenses 144 may be formed over the over-coating layer 142. Each of the microlenses 144 may be formed in a hemispherical shape. The microlenses 144 may converge incident light, and may transmit the converged light to the corresponding photoelectric conversion elements 114*u* and 114*d*. The microlenses 144 may be shifted to correspond to a Chief Ray Angle (CRA) according to the positions thereof.

The upper photoelectric conversion elements 114*u* and the lower photoelectric conversion elements 114*d* may be formed in one-to-one correspondence. In some implementations, whereas the upper photoelectric conversion elements 114*u* may be arranged at uniform intervals in the upper pixel array 110*u*, the lower photoelectric conversion elements 114*d* may be arranged at different intervals in the lower pixel array 110*d* such that the distance (or interval) between adjacent lower photoelectric conversion elements 114*d* varies depending on the positions of the lower photoelectric conversion elements 114*d* formed in the lower pixel array 110*d*.

For example, as shown in FIG. 3, in the center region of the pixel array 100, the lower photoelectric conversion elements 114*d* and the upper photoelectric conversion elements 114u may be formed such that the center of the lower photoelectric conversion elements 114d and the center of the upper photoelectric conversion elements 114u overlap each other in the vertical direction. On the other hand, as shown in FIG. 4, in the edge region of the lower pixel array 110d (e.g., the region closer to B rather than B'), the lower photoelectric conversion elements 114d may be formed to be shifted outward as compared to the upper photoelectric conversion elements 114u. Thus, the lower photoelectric conversion elements 114d formed in the edge region of the lower pixel array 110d may be spaced farther apart from each other than the upper photoelectric conversion elements 114u formed in the edge region of the upper pixel array 110u. For example, the distance between the lower photoelectric conversion elements 114d may gradually increase in the direction from the center of the lower pixel array 110d to the edge of the lower pixel array in response to the chief ray angle (CRA).

In some implementations, the lower pixel array 110d may be divided into a plurality of regions based on distances from the center of the lower pixel array 110d. For example, the lower pixel array 110 may include a first region, a second region, and a third region that are disposed from the center to the edge of the lower pixel array 110d in an order. The distance between any two adjacent lower photoelectric conversion elements 114d may be depend on which region the lower photoelectric conversion elements 114d fall in. For example, the lower photoelectric conversion elements 114d in each of the first to third region is disposed by a same distance, while the lower photoelectric conversion elements 114d in the first region are disposed by a distance that is different from that in the second region and the third region. At this time, as shown in FIG. 3, in the center region of the lower pixel array 110d, the center point of each microlens 144 and the center point of each lower photoelectric conversion element 114d may be arranged to coincide with each other. On the other hand, in the regions located outside the center region of the lower pixel array 110d, each of the lower photoelectric conversion elements 114d may be shifted by a predetermined distance for each region in proportion to a distance away from the center region of the lower pixel array 110d. In this case, the lower photoelectric conversion elements 114d in the same region may be arranged at equal intervals.

Figure 5:
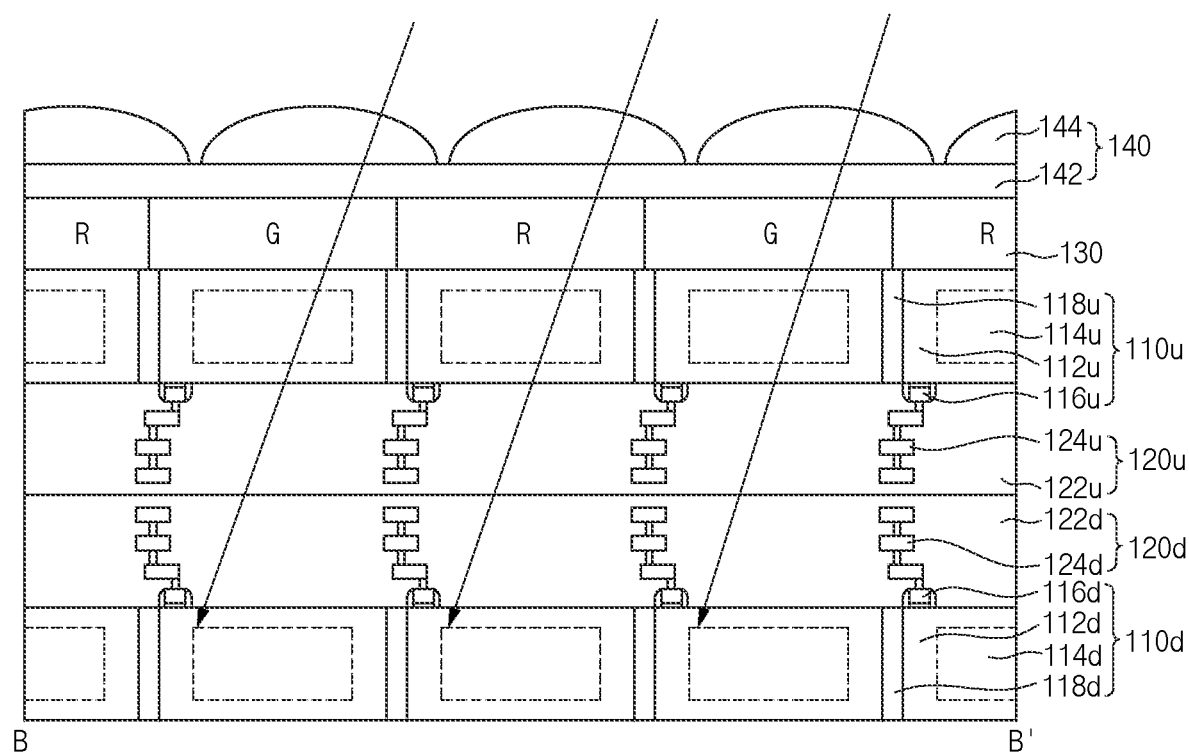
FIG. 5 is a cross-sectional view illustrating problems caused by unbalance in the amount of light that can be generated in a center region and an edge region of the pixel array.

FIG. 5 shows a comparison example that shows an image sensing device having a three-dimensional (3D) stacked structure. In FIG. 5, the lower photoelectric conversion elements of the lower pixel array (Pxd) are arranged by an a uniform interval from the center to the edge region. For the image sensing device with the 3D stacked structure including the upper pixel array (Pxu) and lower pixel array (Pxd), the path of light incident upon the lower pixel array (PXd) may be longer than the path of light incident upon the upper pixel array (PXu). When the lower photoelectric conversion elements 114d are arranged at uniform intervals from the center to the edge of the lower pixel array (Pxd) in the same manner as in the upper photoelectric conversion elements 114u, a sufficient amount of light can also be incident upon the lower photoelectric conversion elements 114d in the center region of the pixel array 100 upon which light is vertically incident, as shown in FIG. 3. However, in the edge region of the pixel array 100 upon which light is obliquely incident, the amount of light incident upon the lower photoelectric conversion elements 114d may be greatly reduced as shown in FIG. 5.

In order to prevent unbalance in the amount of light, the distance (i.e., a distance between lower unit pixels) between the adjacent lower photoelectric conversion elements 114d may gradually increase in response to the chief ray angle (CRA) in the direction from the center to the edge of the lower pixel array 110d. In some implementations, the lower photoelectric conversion elements 114d may be arranged such that a distance between two adjacent lower photoelectric conversion elements 114d is determined based on region which the lower photoelectric conversion elements are located and the distance between two adjacent lower photoelectric conversion elements 114d is greater in the region closer to the edge. In some implementations, in the lower pixel array 110d, the lower device isolation structures 118d may gradually increase in width in the direction from the center to the edge of the lower pixel array 110d in response to the chief ray angle (CRA), or may gradually increase in width in the direction from the center to the edge of the lower pixel array 110d in units of a predetermined region. Accordingly, a sufficient amount of light can be incident upon the lower photoelectric conversion elements 114d of the lower pixel array 110d.

Referring to FIG. 3, in the center region of the pixel array 100, the lower conductive lines 124d may be formed to vertically overlap with the upper conductive lines 124u. In contrast, referring to FIG. 4, in the edge region of the pixel array 100, the lower conductive lines 124d may be shifted by a predetermined distance corresponding to the shifted degree of the lower photoelectric conversion elements 114d, so that the resultant lower conductive lines 124 may be formed to vertically deviate from the upper conductive lines 124u in the edge region of the pixel array 100.

Figure 6:
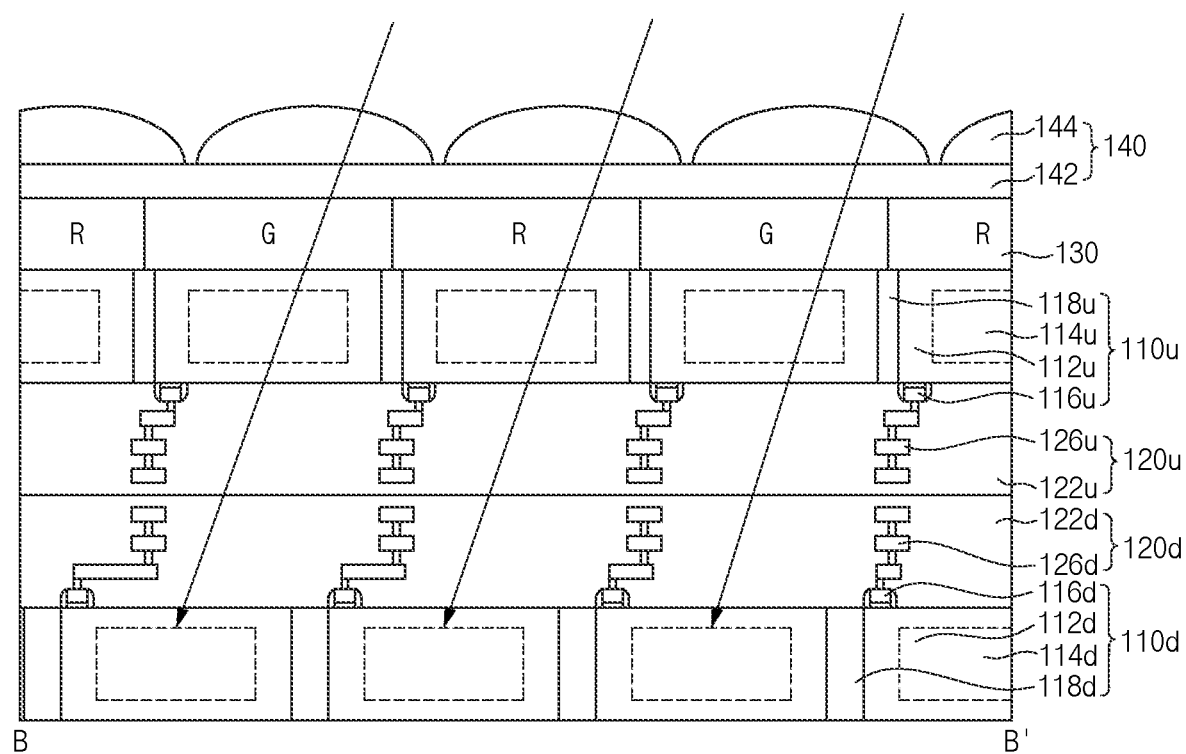
FIG. 6 is a cross-sectional view illustrating an example of the pixel array taken along the line B-B' shown in FIG. 1 based on other implementations of the disclosed technology.

FIG. 6 is a cross-sectional view illustrating an example of the pixel array taken along the line B-B' shown in FIG. 1 based on other implementations of the disclosed technology.

Referring to FIG. 6, even in the edge region of the lower pixel array (PXd), the lower conductive lines 126d of the lower interconnect layer 120d and the upper conductive lines 126u of the upper interconnect layer 120u may vertically overlap with each other.

When the lower conductive lines 126d are also shifted in the edge region of the lower pixel array (PXd) as shown in FIG. 4, a mask for patterning the upper conductive lines 126u and a mask for patterning the lower conductive lines 126d should be manufactured separately from each other. However, as shown in FIG. 6, when the remaining lower conductive lines 126d other than some conductive lines directly connected to the lower pixel transistor 116d are formed at the same position as the upper conductive lines 126u, the corresponding lower conductive lines 126d and the upper conductive lines 126u can be patterned using the same mask. As a result, a manufacturing process of the image sensing device can be facilitated, resulting in reduction in production costs.

The remaining constituent elements other than the above-mentioned elements shown in FIG. 6 are identical to those of FIG. 4, and as such a detailed description thereof will herein be omitted for convenience of description.

As shown by the disclosure of this patent document, the image sensing device based on some implementations of the disclosed technology can be implemented in ways that allow a sufficient amount of light to reach photoelectric conversion elements of a lower pixel array of an image sensing device with a three-dimensional (3D) stacked structure.

Although a number of illustrative embodiments have been described, it should be understood that modifications or enhancements to the disclosed embodiments and other embodiments can be devised based on what is described and/or illustrated in this patent document.

What is claimed is:

1. An image sensing device, comprising:
   a first pixel array configured to include a plurality of first unit pixels consecutively arranged to generate first pixel signals through a photoelectric conversion of incident light; and
   a second pixel array disposed below the first pixel array, and configured to include a plurality of second unit pixels consecutively arranged to generate second pixel signals through a photoelectric conversion of the incident light,
   wherein
      the first unit pixels are arranged to have a uniform spacing between adjacent first unit pixels in the first pixel array; and
      the second unit pixels are arranged so that spacing between adjacent second unit pixels are not the same in the second pixel array.

2. The image sensing device according to claim 1, wherein:
   the second unit pixels are arranged such that a distance between the second unit pixels gradually increases in a direction from a center of the second pixel array to an edge of the second pixel array.

3. The image sensing device according to claim 1, wherein the second pixel array includes a first region distanced from a center of the second pixel array by a first distance and a second region distanced from the center of the second pixel array by a second distance greater than the first distance, and
   wherein second unit pixels in the first region are disposed from one another at a first interval and second unit pixels in the second region are disposed from one another at a second interval.

4. The image sensing device according to claim 3, wherein the second interval is greater than the first interval.

5. The image sensing device according to claim 1, wherein the first unit pixels include:
   first color pixels configured to perform photoelectric conversion of visible light corresponding to a first color;
   second color pixels configured to perform photoelectric conversion of visible light corresponding to a second color; and
   third color pixels configured to perform photoelectric conversion of visible light corresponding to a third color.

6. The image sensing device according to claim 1, wherein:
   the second unit pixels include a plurality of infrared (IR) pixels configured to perform photoelectric conversion of infrared (IR) light.

7. The image sensing device according to claim 1, wherein the second unit pixels include:
   fourth color pixels configured to perform photoelectric conversion of visible light corresponding to a first color;
   fifth color pixels configured to perform photoelectric conversion of visible light corresponding to a second color; and
   sixth color pixels configured to perform photoelectric conversion of visible light corresponding to a third color.

8. The image sensing device according to claim 1, wherein:
   the first unit pixels and the second unit pixels are formed in one-to-one correspondence.

9. The image sensing device according to claim 1, wherein the first pixel array includes:
   a first substrate configured to include a first surface and a second surface opposite to the first surface;
   first photoelectric conversion elements formed in the first substrate, and configured to generate photocharges through the photoelectric conversion of the incident light that is incident upon the first surface of the first substrate;
   first pixel transistors formed over the second surface of the first substrate, and configured to output the first pixel signal corresponding to the photocharges; and
   first device isolation structures formed in the first substrate, and configured to isolate the first photoelectric conversion elements from one another.

10. The image sensing device according to claim 9, wherein:
    the first device isolation structures have a same width across the first pixel array.

11. The image sensing device according to claim 1, wherein the second pixel array includes:
    a second substrate configured to include a first surface and a second surface opposite to the first surface;
    second photoelectric conversion elements formed in the second substrate, and configured to generate photocharges through another photoelectric conversion of the incident light that is upon the first surface of the second substrate;
    second pixel transistors formed over the second surface of the second substrate, and configured to output the second pixel signal corresponding to the photocharges; and
    second device isolation structures formed in the second substrate, and configured to isolate the second photoelectric conversion elements from one another.

12. The image sensing device according to claim 11, wherein:
    the second device isolation structures have different widths across the second pixel array.

13. The image sensing device according to claim 11, wherein:
    the second device isolation structures have widths that gradually increase in a direction from a center of the second pixel array to an edge of the second pixel array.

14. The image sensing device according to claim 11, wherein the second pixel array includes a first region distanced from a center of the second pixel array by a first distance and a second region distanced from the center of the second pixel array by a second distance greater than the first distance, and
    wherein a width of a second device isolation structure in the second region is greater than that in the first region.

15. The image sensing device according to claim 11, wherein:
    the second photoelectric conversion elements are spaced apart from one another at different intervals in a center region and an edge region of the second pixel array.

16. The image sensing device according to claim 15, wherein:
    the second photoelectric conversion elements are arranged such that a distance between the second photoelectric conversion elements gradually increases in a direction from a center of the second pixel array to an edge of the second pixel array.

17. The image sensing device according to claim 15, wherein the second pixel array includes a first region distanced from a center of the second pixel array by a first distance and a second region distanced from the center of the second pixel array by a second distance greater than the first distance, and wherein second photoelectric conversion elements in the first region are disposed from one another at a first interval and the second photoelectric conversion elements in the second region are disposed from one another at a second interval greater than the first interval.

18. The image sensing device according to claim 1, further comprising:

a first interconnection structure coupled to the first pixel array and disposed between the first pixel array and the second pixel array, the first interconnection structure including first conductive lines connected to the first unit pixels; and a second interconnection structure coupled to the second pixel array and disposed between the first pixel array and the second pixel array, the second interconnection structure including second conductive lines connected to the second unit pixels.

19. The image sensing device according to claim 18, wherein:

the second conductive lines vertically overlap with the first conductive lines in a center region of the second pixel array, and deviate from the first conductive lines in an edge region of the second pixel array.

20. The image sensing device according to claim 18, wherein:

the second conductive lines are formed to vertically overlap with the first conductive lines in a center region and an edge region of the second pixel array.

* * * * *